(12) United States Patent
Dongowski et al.

(10) Patent No.: US 6,677,777 B2
(45) Date of Patent: Jan. 13, 2004

(54) SHORT CIRCUIT GENERATOR FOR TESTING POWER SUPPLIES

(76) Inventors: Tilo Dongowski, Stadtjaegerst 6, Augsburg (DE), 86152; Steven Weller, 667 Santos Ct., Milpitas, CA (US) 95035

( * ) Notice: Subject to any disclaimer, the term of this patent is extended or adjusted under 35 U.S.C. 154(b) by 94 days.

(21) Appl. No.: 09/910,990

(22) Filed: Jul. 23, 2001

(65) Prior Publication Data

US 2003/0016048 A1 Jan. 23, 2003

(51) Int. Cl.[7] ............................................. G01R 31/36
(52) U.S. Cl. ........................ 324/771; 324/537; 324/158.1
(58) Field of Search .................................. 324/771, 537, 324/424, 158.1; 361/79–85

(56) References Cited

U.S. PATENT DOCUMENTS

| | | |
|---|---|---|
| 4,037,156 A | 7/1977 | Goujon |
| 4,949,214 A * | 8/1990 | Spencer ........................ 361/95 |
| 5,376,831 A * | 12/1994 | Chen ........................... 327/379 |
| 5,394,025 A | 2/1995 | Pierson |
| 5,397,999 A | 3/1995 | Kanamaru |
| 5,710,701 A | 1/1998 | Brown |
| 5,765,001 A | 6/1998 | Clark |
| 5,784,268 A * | 7/1998 | Steffek et al. ................ 363/55 |
| 5,789,934 A | 8/1998 | Kolkowski |
| 5,962,934 A | 10/1999 | Fendt |
| 6,095,823 A | 8/2000 | Banks |
| 6,183,301 B1 | 2/2001 | Paagman |
| 6,185,520 B1 | 2/2001 | Brown |

* cited by examiner

*Primary Examiner*—Kamand Cuneo
*Assistant Examiner*—Tung X. Nguyen
(74) *Attorney, Agent, or Firm*—Snell & Wilmer LLP; Patrick L. Nixon (57) ABSTRACT

The invention provides a system and method for generating a short circuit in a power supply during power supply reliability testing, where the short circuit generation system may be positioned internal to the computer chassis, and more particularly, may be connected to a computer bus system. The system uses the energy stored in a backup power supply to power the circuitry during the generation of the short circuit. That is, the energy is provided to a shorting circuitry connected to the output of the power supply, such that, the shorting circuitry is driven into linear mode for a predetermined duration roughly equal to the time required for the capacitors to discharge.

20 Claims, 8 Drawing Sheets

(PRIOR ART)

SHORT CIRCUIT GENERATOR FOR TESTING POWER SUPPLIES

BACKGROUND OF THE INVENTION

1. Field of the Invention

This invention generally relates to power supplies, and more particularly, to a system which is capable of providing a short circuit to a power management system during power system reliability testing.

2. Description of the Related Art

The growing demand for electronics and data processing systems is making it increasingly necessary for the electronics and data processing systems to be mass produced in large numbers. Typically, where the systems are mass produced, there exists a concern for making certain that the systems perform within accepted design parameters. One important aspect of the performance evaluation involves determining whether the system power supply will perform reliably when placed in the working environment (e.g. under load, or field conditions).

One particular test known as a "short circuit test" is commonly performed on the power supply prior to leaving the manufacture. The test is used to determine whether the power supply system demonstrates the intended behavior when a short is applied to the power supply for a significant amount of time (e.g., typically, up to about ten milliseconds). By performing the test, a power supply manufacturer is given ample opportunity to gather information pertaining to the operation of the power supply or system application, such as, for example, the trip time of the supply, the maximum (peak) current or voltage during the test, the behavior of the system application or the overall performance of the power supply management system. Where the performance of the power supply management system is evaluated, the system should detect the shorted circuit and turn "off." Once the short is removed, the power management system should turn "on" again, and the system should start up, undamaged.

In general, one of two physical arrangements relative to the operating system chassis is selected for performing the short circuit test. That is, the power supply may be tested using a short circuit generating device which is either positioned outside the system application chassis (external arrangement), or inside the system application chassis (internal arrangement).

In the external arrangement the short circuit generating device is typically connected to the power supply to be tested using thick cables. Typically, the short circuit generating device is positioned some distance from the system application housing. In this way the power supply may be shorted by connecting the thick cables together, and to a grounding potential, or by providing a high voltage impulse signal to the power system to force the power supply into short circuit state.

However, the exterior arrangement for performing the short circuit test is somewhat problematic in that the cables must be extremely thick in order to provide a low enough resistance for the power supply to interpret the signal provided by the cables as a short circuit. Further, the relative thickness of the cables, in turn, tends to make using the external arrangement to short a power supply extremely cumbersome. Further still, the switching of large currents in long thick cables may interfere with other test being formed simultaneously, such as, by creating an artificially generated electromagnetic field.

In an interior arrangement a short circuit generation device is mounted inside the system application chassis where the device is connected to the power management supply system. Further, wires from the short circuit generation device are generally lead outside the chassis to a remote supervisory location, where the shorting process may be controlled.

However, in order to apply a short to the power supply in the interior arrangement, a switching device typically must be used (e.g., a FET, SCR, or relay). In general, the switching devices commonly used in the interior arrangement require additional power in order to properly operate. Consequently, additional power above and beyond that necessary to run the system application must be added to the interior arrangement in order to compensate for the power necessary to operate the switching device. Also, since the power supplying the switching device typically must be maintained for the duration of the test, it cannot be drawn directly from the power supply under test.

One suggestion for solving the problem of providing the added power in the internal arrangement involves utilizing a battery to power the internal switching device. As noted previously, however, the environment in which the short circuit test is performed is often very restrictive. For instance, the computer chassis may be inside an oven, undergoing temperature testing, or in a special chamber undergoing monitoring for electromagnetic interference. Consequently, it is undesirable to use an interior arrangement powered by a battery, since the testing environment in which the battery must operate often includes extreme effects of heat, chemicals, vibration, and shock, none of which can be withstood easily by the battery. Therefore, the interior arrangement generally must draw power from an external source, which leaves the interior arrangement open to many of the same problems experienced by the exterior arrangement (e.g., noise and electromagnetic interference).

Therefore, it is desirable for a short circuit generation device to be self-powered or powered using existing circuitry, so that it may avoid the problems inherent in both the exterior and interior arrangement short circuit testing systems.

Another concern which arises in conventional power supply test methods involves ensuring that the results measured from test to test, or from power supply to power supply are reached consistently, such that, the results may be compared with relative confidence. Typically, where a power source has undergone repeated testing under similar test conditions, the test results will be remarkably different. This is because conventional testing methods generally produce inconsistent short circuits resulting from short circuit generation systems which deliver inconsistent performance due to the restrictive and harsh testing environment.

Hence, a need exist for a short circuit generation system which will deliver consistent and reliable short circuit generation performance during short circuit testing.

Accordingly, presently known short circuit testing systems for computer chassis remain inadequate, particularly in their ability to accommodate the restrictive and sometimes harsh testing environment. Thus, a need exists for a short circuit testing system which is relatively resistive to the extreme environmental variations which accompany short circuit testing and which makes it possible to generate substantially similar short circuits from test to test.

SUMMARY OF THE INVENTION

The present invention provides a short circuit generation system for use in short circuit testing which addresses many of the shortcomings of the prior art. In accordance with various aspects of the present invention, an internal arrangement short circuit generation system is provided, wherein the system induces a short in the power supply of computer chassis during short circuit testing, and additionally may be powered using internal power storage circuitry. Therefore, the present invention provides a testing system that is reliable, robust, and repeatable, notwithstanding short circuit testing conditions.

In accordance with one exemplary embodiment of the invention, the short circuit generation system may be located within the housing of the power supply management system. In accordance with another aspect of the invention, the short circuit generation system may be located within the system application chassis.

In accordance with another exemplary embodiment of the invention, the short circuit generation system may comprise a task switch for manual control of test initiation.

In accordance with another exemplary embodiment of the present invention, a system is provided wherein the short circuit generation system comprises automated initiation.

In accordance with another exemplary embodiment of the invention, a short circuit generation system may be self powered during short circuit testing.

In accordance with another exemplary embodiment of the invention, a short circuit generation system is provided which may be configured to generate short circuits of varying duration.

Further, in accordance with another exemplary embodiment of the invention, a short circuit generation system is provided which may be configured to generate short circuits for varying power supply voltages.

BRIEF DESCRIPTION OF THE DRAWINGS FIGURES

A more complete understanding of the present invention may be derived by referring to the various exemplary embodiments of the present invention which are described in conjunction with the appended drawing figures in which like numerals denote like elements, and in which.

DETAILED DESCRIPTION OF VARIOUS EXEMPLARY EMBODIMENTS

The present invention may be described herein in terms of various functional block components, electrical circuit representations and processing steps. It should be appreciated that such functional blocks, components and steps may be realized by any number of hardware or software components configured to perform the specified functions. For example, the present invention may employ various integrated circuit components, e.g., memory elements, digital signal processing elements, logic elements, look-up tables, and the like which may carry out a variety of functions under the control of one or more microprocessors, microcontrollers or other control devices. In addition, those skilled in the art will appreciate that the present invention may be practiced in conjunction with any number of power supply management systems, wherein it may be necessary to perform short circuit testing of the power supply management system or the associated power supply receiving unit or system application. In addition, those skilled in the art will appreciate that the present invention may be practiced in any number of power supply testing contexts wherein it may be necessary to evaluate the power source of an electrical system and, therefore, the exemplary embodiment relating to a computer power supply as described herein is merely one exemplary application for the invention.

In accordance with the present invention, a short circuit generation system comprises a short circuit generator for providing a short to a power supply management system during power supply or load testing. In accordance with one aspect of the present invention, the short circuit generator comprises a test initiation circuitry or device, a debouncing and rise-time control circuitry and a shorting circuitry. The short circuit test is commenced by the initiating circuitry which is suitably configured to provide a predetermined "start" signal to the debouncing and rise-time control circuitry. The debouncing and rise-time control circuitry is suitably configured to provide an appropriate signal to the shorting circuitry which triggers the shorting circuitry to short the output of the power supply management system.

In accordance with one aspect of the invention, the initiating circuitry may be a manual switching device for initiating the short circuit in the power supply. A typical device in accordance with this aspect of the invention may be, for example, a push button, a tap button, an on-off latch, a touch sensory button, or any such on-off switch capable of providing a system start and/or stop signal for controlling the initiation and termination of the short circuit test.

In accordance with another aspect of the present invention, the initiating circuitry or device may comprise controlling circuitry or programmable software which may be utilized to automatically initiate the short circuit test. Typical controlling circuitry for automatically initiating the test may be programmable. Alternatively, the controlling circuitry may be used to control the duration of the short circuit test. In addition, the controlling circuitry may be self-powered, or powered by any one of the circuit components in the short circuit generation system. Further, typical software for use with the system may be any conventional software capable of controlling electrical circuitry such as, processor cards, memory cards, I/O cards or any like components capable of being managed using any conventional programming or scripting language.

In accordance with yet another aspect of the invention, the short circuit generator comprises debouncing and rise-time control circuitry configured to control the overshooting and rise time of the initiating signal. The quantification of overshoot and the rise-time of the start signal may be predetermined by the short circuit generator system operator. In accordance with an exemplary embodiment of the present invention, the debouncing and rise-time control circuitry suitably comprises any circuitry for providing an appropriate voltage or current for starting or stopping the short circuit test. In addition, the debouncing and rise-time control circuitry may be self-powered, or powered by any one of the components of the short circuit system. Moreover, where necessary, the short circuit debouncing and rise-time control circuitry may include signal amplification or filtering circuitry for augmenting the initiating signal or controlling the noise level of the initiating signal provided by the initiating circuitry.

In further accordance with another exemplary embodiment of the present invention, the short circuit generator includes shorting circuitry for providing a short to the power management supply system. The shorting circuitry may comprise any configuration for sending the output of the power supply management system to ground, or providing sufficient voltage or current to send the power supply into an overload state, such that a switch or relay is tripped causing the power supply to permanently or temporarily cease operation.

To further explain in more detail various aspects of the present invention, exemplary embodiments of a short circuit generation system as used with a system application system and power supply will be provided. It should be appreciated that the particular implementations shown and described herein are illustrative of the invention and its best mode and not intended to otherwise limit the scope of the present invention in any way. Indeed, for the sake of brevity, conventional and well known concepts of shorting grounding or overloading of power supplies, current, voltage, power and control electronics, integrators, transistor and switching technology, shunt capacitance or resistance, and other functional aspects of the system (and components of the individual operating components of the system) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical power management system.

Having described various aspects and features of the short circuit generation system, the operation of an exemplary embodiment of the present invention will now be described. Although the present embodiment will be described with respect to its use with a computer system or PC, it is to be understood that the present invention is not so limited. For example, the present invention may be used with any system wherein the testing of the power supply management system is desired, such as equipment with demands on high availability, high quality and/or high security. Typical systems which may employ a short circuit generation system may include, routers, hubs, servers, base stations, exchange and relay centers, and life support and life sustaining systems.

Figure 1:
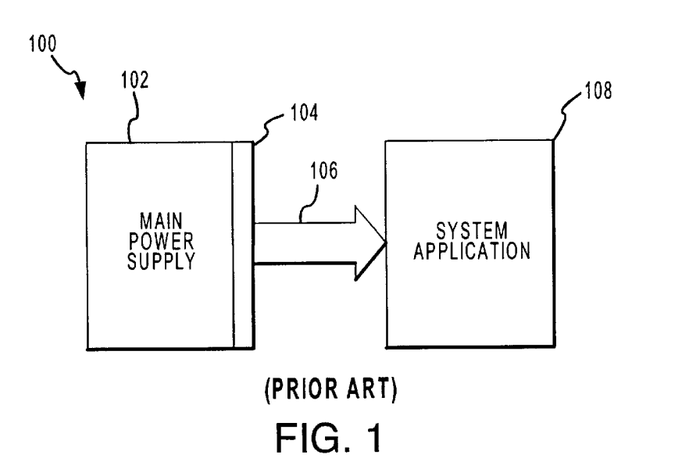
FIG. 1 illustrates a block diagram of a prior art power supply management system.

With reference to FIG. 1, a typical prior art embodiment of a power supply management system 100 is shown. In FIG. 1, there is shown a main power supply 102 including a planar connection 104 for providing specified voltage signals through connector circuitry 106 to a system application 108. The system application of the present example is a personal computer (PC) system which is connected to an AC power source through the main power supply 102. The power supply in turn may provide various output voltages at specific load conditions through planar connector 104, which is suitably connected to the PC system 108. For example, one standard for PCs requires that voltages of +12, +5, −5 −12 and a reference potential be furnished at the planar 102 for application to a PC system.

Figure 2A:
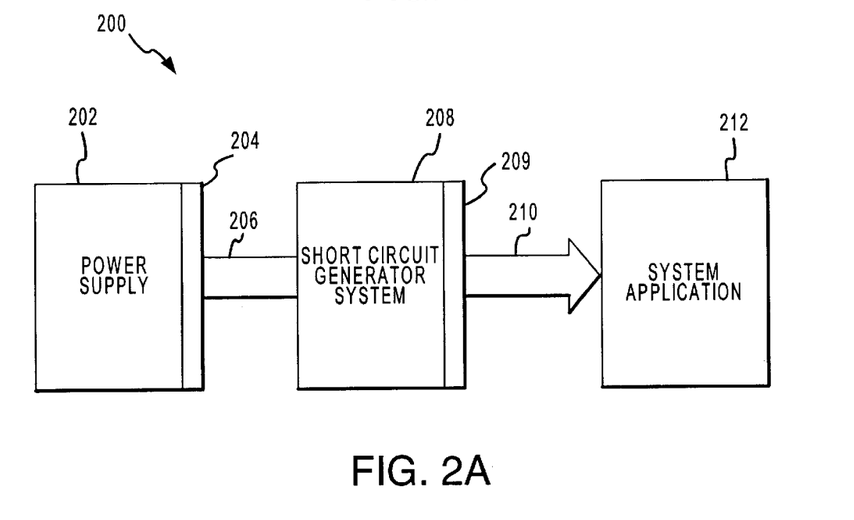
FIG. 2A illustrates a block diagram of another exemplary embodiment of a short circuit generator system in accordance with the present invention.

FIG. 2A depicts an application of an exemplary embodiment of a short circuit generation system 200 in accordance with the present invention. Short circuit generation system 200 comprises short circuit generator system 208 connected through a planar interface 204 and a connector 206 to a power supply 202. The short circuit generator system 208 is connected in parallel via a connector 210 to a system application 212 and may be included as part of a larger power supply management system feeding the system application 212 through a second planar connection 209.

While FIG. 2A shows the short circuit generation system 208 connected to power supply 202 via planar interface 204 and connector 206, it should be understood that short circuit generator system 208 may alternatively be connected to the power supply 202 independent of any direct connection to the system application 212. For example, with reference to FIG. 2B, an alternate embodiment depicts a short circuit generator system 208 connected to power supply 202 via planar interface 209 and connector 210. In this arrangement, short circuit generator system 208 may operate to short power supply 202 independent of any direct interaction with system application 212.

In an alternative embodiment, the short circuit generator circuitry may be implemented in a system as a stand alone circuit or chip. That is, short circuit generator may be implemented as part of a printed circuit board or the like. Such printed circuit board (PCB) may additionally be adapted to plug into a conventional computer circuit board or bus system.

Figure 3:
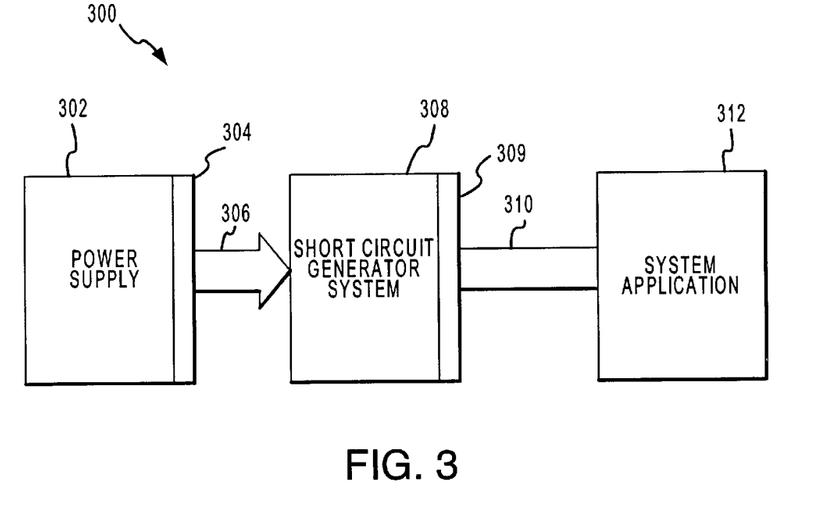
FIG. 3 illustrates a block diagram of yet another exemplary embodiment of the short circuit generator system in accordance with the present invention.

Referring now to FIG. 3, an alternate embodiment of a power management system 300 including the short circuit generator system 308 is shown. In this particular embodiment, the short circuit generation system 308 is connected to the system application 312 via planar connector 309 and/or bus 310, such as, through its incorporation onto a PCB. Where the system application is a PC as described herein, the short circuit generation system may be configured to connect to (i.e., "plug into") the PC through any conventional bus architecture or protocol 310. In accordance with one aspect of this embodiment, bus 310 may comprise any conventional bus architecture according to promulgated standards. For example, Versa Module European (VME) bus system, Industry Standard Architecture (ISA), Extended Industry Standard Architecture (EISA), Micro Channel Architecture (MCA), Peripheral Component Interconnect (PCI) local bus, or any of such standards as are promulgated by the Institute of Electrical and Electronics Engineers (IEEE) including IEEE 488 general-purpose interface bus (GPIB), IEEE 696/S-100, and the like, are all appropriate. Consequently, while the present invention may be described with respect to a VME bus system, it should be noted that the invention is not so limited.

Figure 2B:
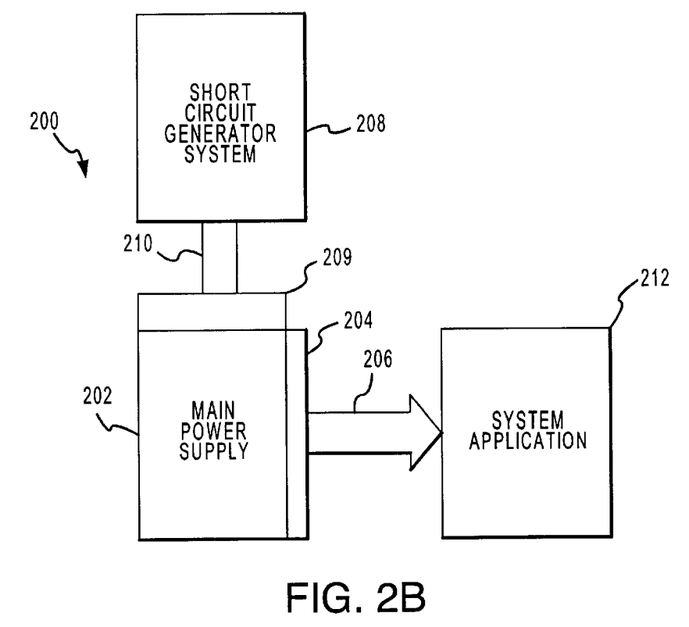
FIG. 2B illustrates a block diagram of another exemplary embodiment of a short circuit generator system in accordance with the present invention.

While FIGS. 1–3 depict exemplary embodiments of the short circuit generation system connected to the power supply or the system application, it should be noted that the short circuit generation system of the present invention may also be connected inside the aforementioned components. Indeed, while the details of the various embodiments of the present invention are described through the various well known connection methods, it is to be understood that such connections can occur inside or outside the traditional power management components, with respect to the power supply housing or the system application chassis. Further, it should be understood that the various connections methods described herein are merely exemplary and preferred methods, and as such, are not intended to limit the scope of the present invention in any way.

Figure 6:
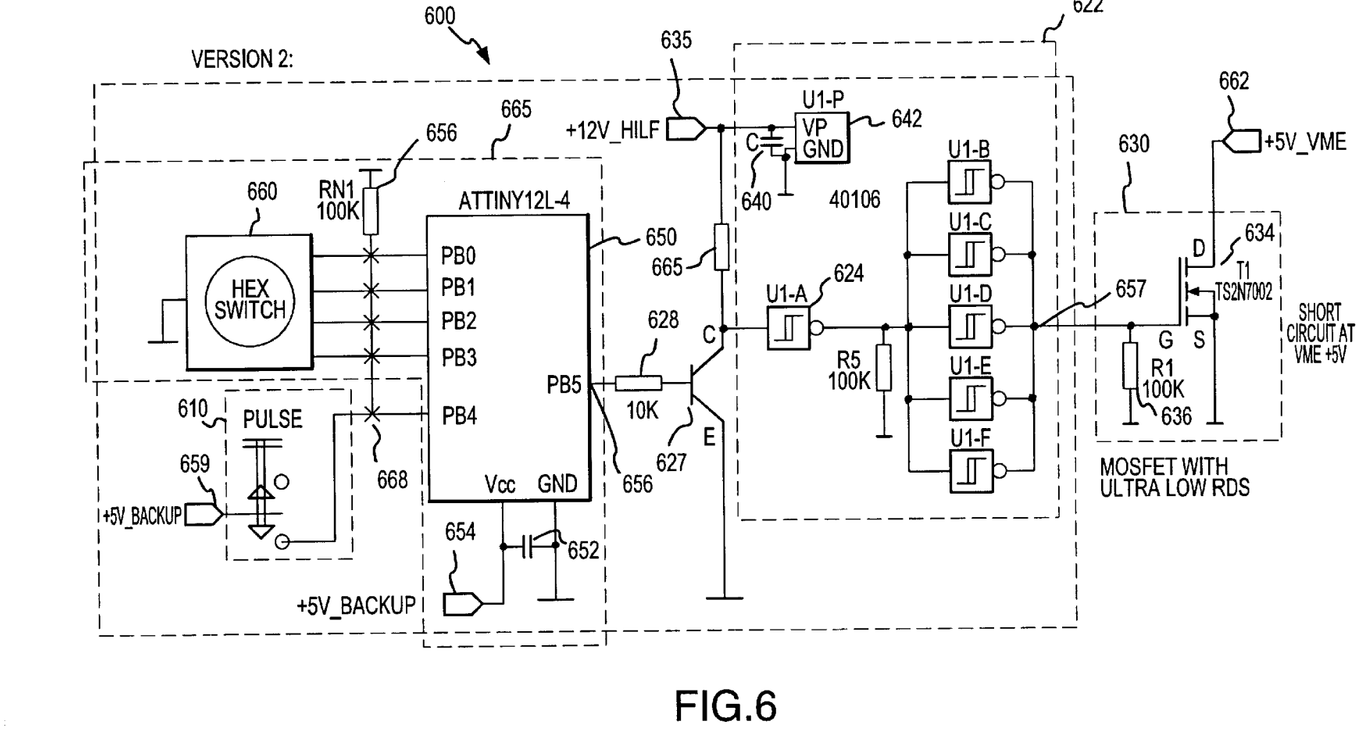
FIG. 6 illustrates another schematic of an exemplary embodiment of a short circuit generator in accordance with the present invention.

With reference now to FIGS. 4 and 6, exemplary circuit embodiments of the present invention are illustrated. Again, it should be noted that the circuits described herein are merely exemplary and preferred embodiments of the invention and that the particular implementations shown and described are not intended to otherwise limit the scope of the invention in any way. Further, for the sake of brevity, conventional transistor biasing and switching technology, signal integration and inversion, and commonly understood rules of capacitance and resistance may not be described in detail, herein. That is, the circuit elements disclosed herein (e.g., diodes, hex switches, microcontrollers, transistors, capacitors, resistors, integrators and inverters) are of any conventional construction configured to perform the functions described below. Furthermore, the connecting lines shown in the various figures contained herein, are intended to represent exemplary functional relationships and/or physical couplings between the various elements. It should be noted that many alternative or additional functional relationships, physical connections, or conventional power supply management elements may be present in a typical power supply management system, such as a voltage and current monitors, over voltage clamps, and power saving switches.

Figure 4A:
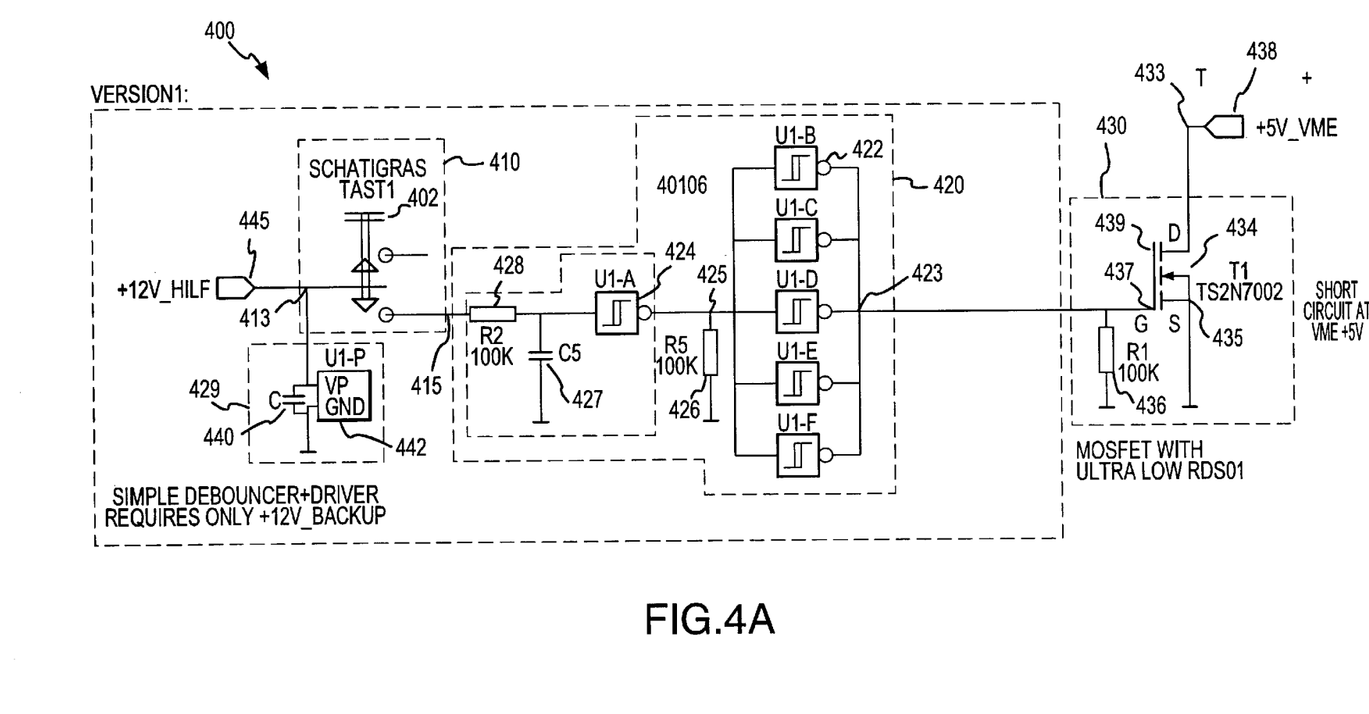
FIG. 4A illustrates a schematic of an exemplary embodiment of a short circuit generator in accordance with the present invention.

Referring now to FIG. 4A, an exemplary embodiment of short circuit generator system 400 is shown. In accordance with this embodiment, the short circuit generator system 400 is configured to provide a short in a system application utilizing a VME bus system (not shown). Accordingly, the present invention will be discussed in terms of VME protocol and architecture (e.g., VME–5, +5, –12, and +12 Voltages). As depicted in FIG. 4A, the short circuit generator system 400 comprises an initiating circuitry 410, a debouncing and rise time control circuitry 420 and a shorting circuitry 430, and is configured to provide a short at VME+ 5V.

In addition, the VME bus +5 voltage 438 terminal is connected to a node 433 which is, in turn, connected to the drain 439 of a Field Effect Transistor (FET) 434 included in shorting circuitry 430. The source terminal of the FET 435 is connected to a ground reference potential which is available from the VME bus (not shown). The gate 437 terminal of the FET 434 is also connected through shunt resistor 436 to ground, and to the debouncing and rise-time control circuitry 420.

While shorting circuitry 430 is depicted utilizing a n-channel FET, it should be noted that the present invention is not to be so limited. That is, FET 434 may be any transistor suitable for providing a short to a power supply or power management system, such as FETs, Bipolar Transistors, MOS Transistors, and the like. In addition, FET may be any suitable transistor or switching device) capable of being optically controlled, and which may be further capable of clamping the power supply. A typical transistor for use in shorting circuitry 430 may include any transistor (e.g., switching device) with very low on-resistance. Moreover, the topology of conventional transistors which may be suitable for use with this invention may comprise any well known topology in the art. For example, a number of such prior art elements are described in detail in DIGITAL INTEGRATED CIRCUITS (1st ed. 1996) by Thomas A. DeMassa and Zack Ciccone, the entire contents of which are incorporated herein by reference. Accordingly, transistor switching, operational modes, and biasing will not be discussed in detail herein.

As illustrated in FIG. 4A, a +5 volt VME bus voltage is depicted as the source to be shorted. However, the present invention is not to be so limited. In particular, various embodiments of the present invention may be configured to short a +12 volt VME bus voltage or a –12 volt VME voltage supply, or the like. To short the alternative voltages (e.g., –12 volt VME bus voltage and the like), changes may be made to accommodate the biasing of the shorting circuitry, such as utilizing suitable switching technology. For example, a p-channel MOSFET may be used in shorting circuitry configured to provide a short to a –12 volt VME bus voltage supply. Indeed, while short circuit generation system 400 is shown configured to provide a short in a VME bus voltage supply system 438, the short circuit generation system 400 may be configured to provide a short in any system wherein the testing of a power supply management system is desired.

Debouncer and rise time control circuitry 420 may comprise any circuitry for debouncing the signal provided by initiating circuitry 410 via backup supply voltage 445, and inverting the signal prior to providing the signal to the gate 437 of transistor 434. More particularly, control circuitry 420 may include any circuitry for filtering noise distortion from the signal provided by initiating circuitry 410, and additionally inverting the provided signal as required by the gate 487 of transistor 434 connected to the circuitry 420.

With particular reference to FIG. 4A, the debouncing and rise-time control circuitry 420 is additionally configured such that the gate 437 of FET 434 is connected to U1-B-U1-F inverters 422 at node 423. At node 425, the inverters 422 are additionally connected to unitary inverter 424 and to ground via resistor 426, wherein register 428 and capacitor 427 in combination may provide noise dampening and filtering. Unitary inverter 424 is further connected to the initiator system 410 via resistor 428, and to ground via capacitor 427. Further, the initiator system 410 is additionally connected to power supply pin 429 and backup supply voltage 445 via node 413.

In accordance with one embodiment of the invention depicted in FIG. 4A, resistor 428, capacitor 427 and inverter 424 act in combination to debounce (e.g., filter) the signal provided by initiating circuitry 410, prior to providing the signal to inverters 422. That is, the switching transients of the signal provided by circuitry 410 may be dampened and/or the signal may be multiplied by a unitary integrator to provide a more predictable signal response.

Figure 4B:
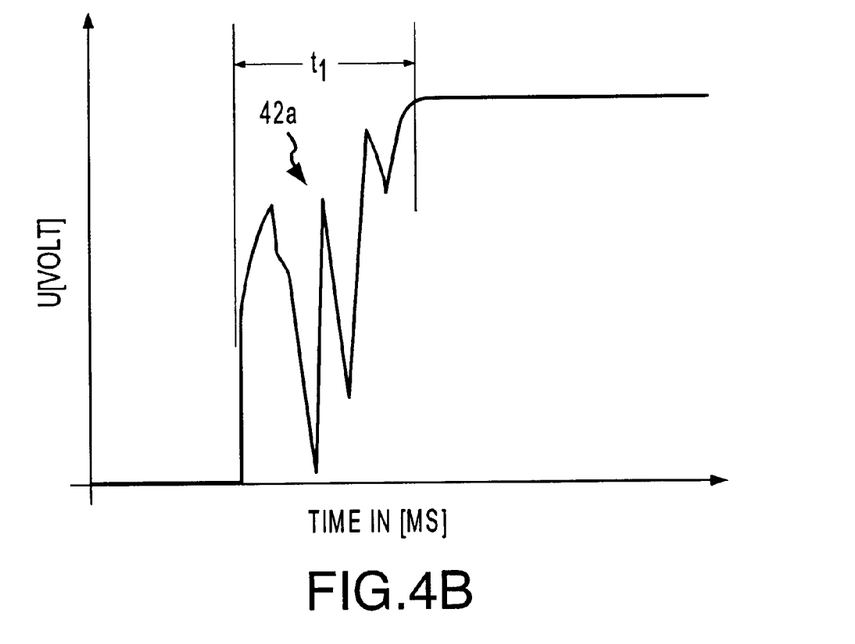
FIGS. 4B–D are a graphical representation of a debounced signal in accordance with the operation of the debouncing circuitry of this invention.
Figure 4C:
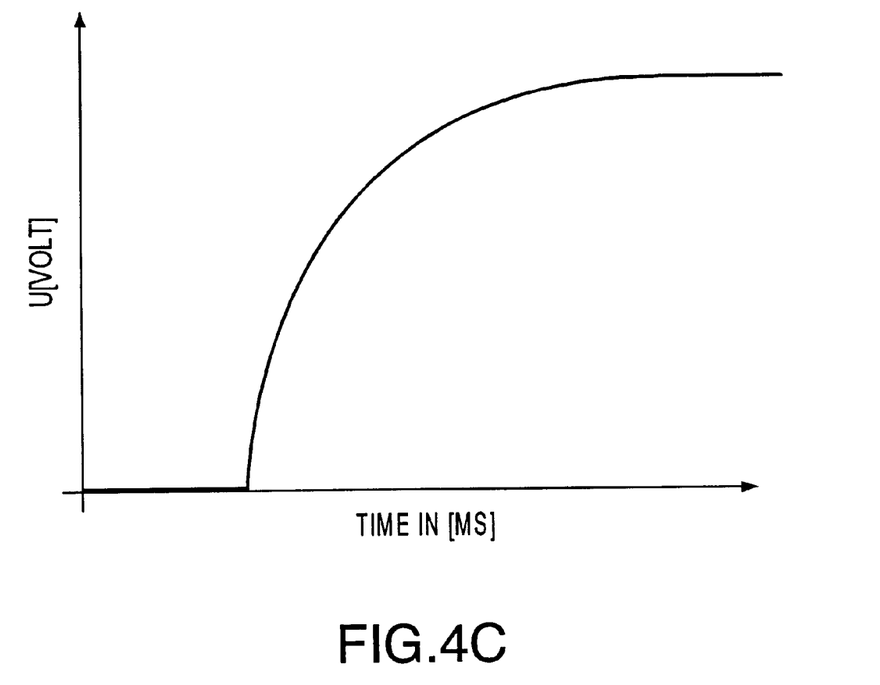
Figure 4D:
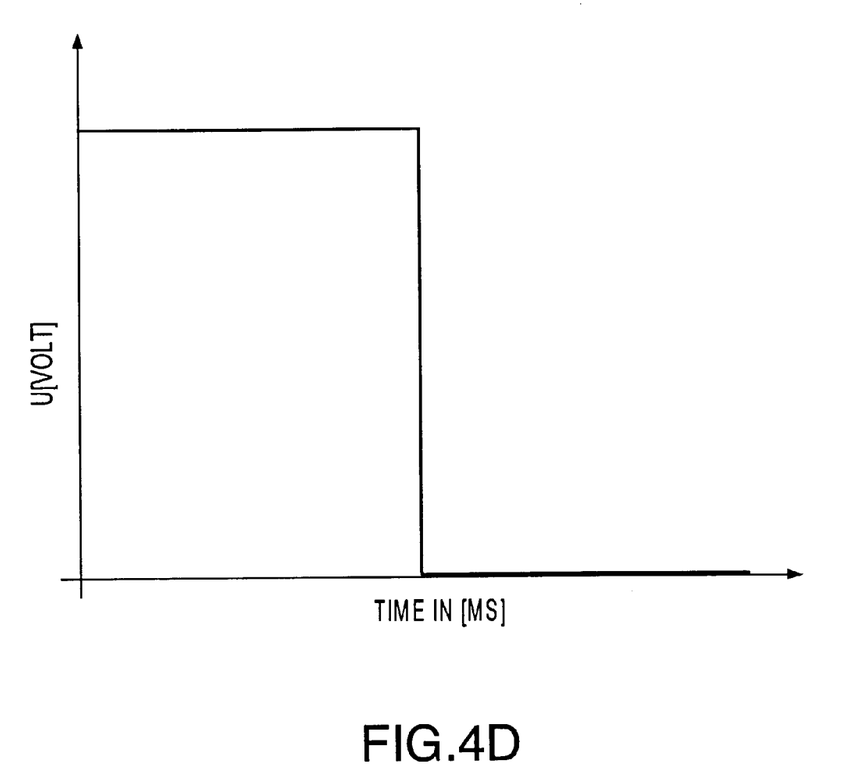

FIGS. 4B–4D illustrate typical graphical representations of the signal responses as the signal by circuitry 410 is debounced, although it should be understood that other debouncing circuitry and components may be used. For example, FIG. 4B is an exemplary graphical representation of the signal provided by circuitry 410 prior to debouncing. As shown in FIG. 4B, once the initiating circuitry 410 is activated (e.g., pressed), the circuitry 410 provides a signal to resistor 428 which includes switching transients 42a. The switching transients 42a cause the signal provided by circuitry 410 to bounce sharply during a time, $t_1$ (e.g., bounce time). The signal is then filtered by the resistor 428 and capacitor 427 such that signal is dampened as shown in FIG. 4C substantially eliminating the switching transients. FIG.

4C shows an exemplary graphical representation of the signal once it has been filtered by resistor 428, capacitor 427, prior to providing the signal to inverter 424. At inverter 424, the signal provided by circuitry 410 is inverted by inverter (integrator) 424, prior to providing the signal to inverters 422. As can be seen by FIG. 4D, the signal provided by inverter 424 may be graphically represented as the output of a conventional integrator.

Further, inverters 422 may be utilized in the present circuitry to provide a low impedance output to drive, for example, the gate 437 of the FET 434. In one embodiment, the low impedance output may cause the FET 434 to switch with a fast rising and fast falling edge (e.g., less than 5 $\mu$s) resulting in a fast (e.g., good or desirable) short circuit. It should be noted, however, that the characteristics of the rising and falling edges depends on the complexity of the shorting circuitry used. For example, where more complex circuitry may be necessary, such as, to archive faster rising or falling edges or to where the shorting circuitry requires higher driving voltages or currents the falling or rising edge of the shorting circuitry output may vary accordingly. That is, the rising or falling edge of the shorting circuitry 430 output may vary as required by the application.

As mentioned above, the design and operation of inverters is well known in the art and accordingly, will not be discussed in detail, herein. Moreover, as is shown in FIG. 4A, the power chip supply pin 429 of the above noted integrated chip comprises a capacitor 440 in parallel combination with the integrator 442 for stabilizing the noise of the signal provided to the integrated chip. In the exemplary embodiments, inverters 422 and unitary inverter 424 may be realized using conventional integrated chip technology. For example, FIG. 4A depicts the use of integrated chip 40106. Integrated chip 40106 may be any one of like chips manufactured by HARRIS (Par. No. CD40106BE) or ST (Part Nos. HCC40106B or HCF40106B) or ON subsidiary of Motorola (Part No. MC140106B).

In accordance with one embodiment of the present invention, initiator system 410 may comprise any task key, or task switch configured to commence the short circuit test, such as, for example a flip switch manufactured by KNITTER SWITCH (Part Type: ATE1G-RA). Other examples of typical switches which may be used in the invention include a push button switch manufactured by ITT (Part Type: KSA) or any switch suitable for remote operation relays or photo couplers A more complete understanding of the operation of the short circuit generator system 400 of FIG. 4A can be realized when discussed in conjunction with the backup supply system 500 of FIG. 5. The backup supply system 500 of FIG. 5 may be used to supply the short circuit system 400 circuitry during the short circuit testing. In particular, back up system 500 may be any system suitable for storing and supplying the voltage necessary to operate the inverter integrated chip technology and for ensuring that shorting circuitry 430 operates to short the power supply being tested.

Figure 5:
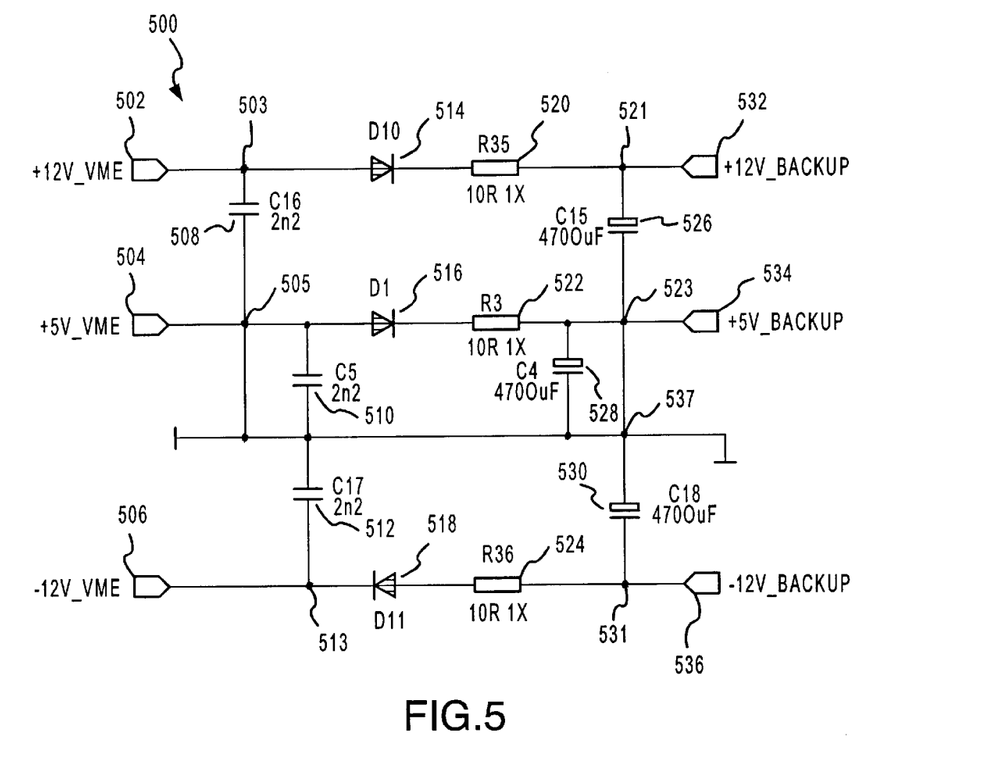
FIG. 5 illustrates a schematic of an exemplary embodiment of a backup power supply in accordance with the present invention.

With particular reference to FIG. 5, backup supply system 500 includes VME bus voltages 502, 504, and 506, which are connected variously to capacitors 508, 510, 512, 526, 528, and 530 for storing voltages for use in supplying the short circuit generator circuitry 400 during the short circuit test. In addition, backup system 500 includes diodes 514, 516, and 518 for preventing the capacitors 508, 510, 512, 526, 528, and 530 from being instantaneously discharged, such as by sending the charge on the capacitor to ground during performance of the short circuit test. Also depicted in FIG. 5 are in line load resistors 520, 522, and 524 for dampening any noise which may be impressed upon the signals provided by bus voltages 502, 504, and 506 In addition, because of the high charge current of the capacitors 526, 528, and 530 during switch on, load resistors 520, 522, and 524 may operate to prevent the power supply under test from detecting a short circuit condition when powering on. Further, the use of capacitors for storing energy, resistors for noise damping, and diodes for circuit protection are well known in the art. As such, the principles of capacitance, resistance and diode construction and use will not be discussed in detail. Further, it should be noted that any conventional diode suitable for protecting electrical circuitry may be used in accordance with various exemplary embodiments of the present invention, such as, for example, Schottky diodes, PN junction diodes and the like.

As depicted in FIG. 5, bus voltage 502 (+12 volts) is connected to capacitor 508 and to the cathode terminal of diode 514 via node 503. The anode terminal of diode 514 is further connected to back up voltage terminal 532 (+12 volts) and capacitor 526 via resistor 520 and node 521. VME bus voltage 504 (+5 volts) is connected to capacitors 508 and 510, and to the cathode terminal of diode 516 via common node 505. The anode terminal of diode 516 is further connected to resistor 522 which is further connected to back up voltage terminal 534 (+5 volts) and capacitor 528 via node 523. VME voltage bus 506 (−12 volts) is connected to capacitor 512 and to the anode terminal of diode 518 via common node 513. In addition, the cathode terminal of diode 518 is connected to resistor 524, which is further connected to capacitor 530 and backup voltage 536 (−12 volts) via common node 531. In addition, as can be seen in FIG. 5, capacitors 510, 512, 528, and 530 are connected together at common node 537.

While the embodiment depicted in FIG. 4A is configured to provide a short in a VME+5 volt system, the short circuit system 400 may be configured to provide a short in any system wherein the testing of a system power supply management system is desired. Indeed, although FIG. 4A will be described herein with reference to the VME bus voltages 502, 504, and 506 (e.g., +12 volts, +5 volts and −12 volts), the embodiments depicted in accordance with the present invention are merely exemplary and preferred embodiments and therefore, may be configured to operate with respect to other voltage ranges not mentioned, herein.

During operation, the short circuit generator system 400 is inserted into a power supply management system (see FIGS. 2A, 2B and 3). As noted, in accordance with various embodiments of the present invention, short circuit generator system 400 may be inserted into the power supply or the computer chassis of the power management system. Further, VME bus voltages 502, 504, and 506 are configured to provide a suitable charge to capacitors 508, 510, 512, 526, 528, and 530, for powering the short circuit circuitry during the performance of the short circuit test, where the suitability of the charge is determined by the requirements of the elements of the short circuit generator system 400 employed. For example, inverters 422 and 424 of FIG. 4A may require a +12 VME bus voltage to debounce and control the rise-time of the signal provided at node 415. Accordingly, debounce and rise-time control circuitry 420 may be provided a +12 volt supply such as that provided at node 521 of FIG. 5.

With particular reference to FIGS. 4 and 5, node 445 may be connected to node 532 for providing a +12 volt signal to initiating circuitry 410. Once task key 402 is engaged or pressed to start the short circuit testing, a suitable voltage signal is provided from backup supply system 500 via backup voltages 532, 534, and 536. More particularly, capacitors 526, 528 and 530 provide a sustaining charge to the short circuit generator system 400, where the charge is delivered to debouncing and rise-time control circuitry 420 via initiating circuitry 410. At the debouncing and rise-time control circuitry 420, a signal is debounced by the debouncing circuitry comprised of resistor 428, capacitor 427 and inverter 424. That is, a voltage signal provided to the debouncing circuitry is noise dampened and controlled to prevent signal overshoot. The debounced signal is then provided to inverters 422 which, in turn, inverts the voltage signal prior to delivering the signal to shorting circuitry 430. The voltage signal is further provided to the gate 437 of transistor 434, such that the voltage measured from the gate 437 of the transistor to the source 435 of the transistor (i.e., the Vgs) is greater than the threshold voltage of the transistor (Vt). The Vgs to Vt relationship, in turn, sends the transistor into linear mode thus shorting the power supply to be tested (e.g., +5 volt VME bus power supply for the embodiment depicted in FIG. 4A). The short generated in the power supply to be tested is then maintained during the short circuit test by the charge delivered from capacitors 526, 528 and 530, such that the duration of the short circuit is maintained while the charge from the capacitors sustains the Vgs at a level greater than the Vt.

The short circuit testing of power supplies may be performed for a short duration. For example, a typical short circuit test may be performed during one to ten milliseconds. Further it may be necessary to test several power supplies during one short circuit test iteration, such as, testing the +5 volt and +12 volt bus voltages in sequence. Consequently, it is desirable for a particular short circuit testing system to be able to be configured such that the user may control the duration of the short circuit as well as the power source to be shorted.

Turning now to FIG. 6, a short circuit generator system 600 is depicted in accordance with another embodiment of the invention. The short circuit generator system 600 comprises short circuit program selection and signal debouncing circuitry 665, inverting circuitry 622, shorting circuitry 630, and task initiating circuitry (e.g., task switch) 610. Notably, shorting circuitry 630, inverters 622, and task switch 610 may have similar construction as those like elements described in FIG. 4A. Consequently, the design, construction, and operation of those elements will be discussed only briefly with respect to FIG. 6. That is, task switch 610, inverters 622, and shorting circuitry 630 are analogous to the like elements of FIG. 4A, and accordingly, may be of any conventional construction for performing similar functions as similar elements describes with respect to FIG. 4A.

Shorting circuitry 630 is connected to inverters 622 and dampening resistor 636 via node 657. Inverters 622 are additionally connected to the collector of transistor 627 and to backup voltage 635 (+12v backup) via resistor 665. Further, the emitter of transistor 627 is connected to a grounding potential, and the base of transistor is connected to microcontroller 650 via resistor 628. Further still, microcontroller 650 is additionally connected to hex switch 660, task key 610 and pull-up resistors 656 via common nodes 668.

As noted, in accordance with an exemplary embodiment of the present invention, the transistor utilized in this embodiment may be of any conventional construction for providing signal switching. That is, although transistor 627 has been described above with respect to a Bipolar Junction Transistor (BJT), the present invention is not so limited. For example, any conventional transistor such as those described above with respect to FIG. 4A are suitable for use with the embodiment depicted in FIG. 6.

It addition, a specialized MOSFET driver device like the type NCP4421P manufacturer by ON, may be used in place of the combination of the transistor 627, resistor 628, and the inverters (e.g., drivers) 622. In this instance, the specialized MOSFET device may be capable of driving the short circuiting device 630 into short in less than 100 ns, thereby generating a short circuit with typically fast rising and/or falling edges.

The short circuit program selection and signal debouncing circuitry 665 further includes a microcontroller 650 for storing various short circuiting programs (e.g., subroutine) and debouncing the signal provided by task key 610, and a hex switch 660 for selecting at least one of the short circuit programs stored in microcontroller 650. The microcontroller 650 may be of any conventional construction for storing short circuit programs or subroutines and selecting predetermined short circuiting sequences. That is, microcontroller 650 may be programmed or configured to provide a short circuit in accordance with an operator selected program.

Further, microcontroller 650, may be additionally configured to debounce a power supply signal, such that signal overshoot (e.g., switching transients) is controlled. A typical microprocessor suitable for use in accordance with the present invention may include a program memory on chip, and/or a low current consumption and a flexible working voltage range, such as, for example, the ATtiny12L-4, uController manufactured by ATMEL Corporation (type ATtiny12L-4). In one particular embodiment, the ATtiny 12L-4 may provide a 3v to 5v supply voltage range, an on-chip RC-oscillator (1 Mhz), an on-chip memory and the housing with low pin count (e.g., 8 pins).

Microcontroller 650 comprises three selectable short circuit programs, PB0–PB3, such that at least one of the programs or a combination thereof may be selectively initiated by the system operator. Further, microcontroller 650 is powered by and connected to +5 volt backup supply 654 and capacitor 652, which is additionally connected to the ground terminal of microcontroller 650. Further, hex switch 660 is configured to enable the short circuit test operation to select at least one of, or a combination of the programs configured into microcontroller 650.

The hex switching technology utilized may comprise various forms, now known, or hereinafter devised. Although FIG. 6 depicts the use of a hex switch 660, it should be noted that the invention is not to be so limited. That is, any such switch capable of providing selectability of microcontroller sequences may be suitable for use in this embodiment, such as, for example, DIP-switches, rotary switches, BCD coding switches, HEX-Switches (e.g. HARTMANN type PT65 106), PK-COMPONENTS type KDC-16 DIP-Switches, COPAL type CHS04 BCD Coding Switches (e.g CHERRY type PBC 1E-015) and the like.

As with FIG. 4A, the operation of the short circuit generator system 600 of FIG 6 will be understood with reference to backup supply system 500 of FIG. 5. That is, +12v backup supply voltage 532 may be connected to supply terminal 635. Further, +5v backup supply voltage 534 may be connected to task key 610 via node 659, and to microcontroller 650 at terminal 654. In accordance with this exemplary embodiment, the +5v VME bus voltage is configured to be shorted. Consequently, the +5v VME bus voltage may be connected to terminal 662, and the drain of FET 634 of shorting circuitry 630.

Further, while the embodiment depicted in FIG. 6 is configured to provide a short in a VM+5v system, the short circuit system 600 may be configured to provide a short in any system wherein the testing of a system power supply management system is desired. Indeed, although FIG. 6 will be described herein with reference to the VME bus voltages 502, 504, and 506 (e.g., +12 volts, +5 volts and −12 volts) the embodiments depicted in accordance with the present invention are merely exemplary and preferred embodiments and therefore, may be configured to operate with respect to other voltage ranges not mentioned herein.

In operation, a short circuit generator operator configures hex switch 660 to select at least one short circuit test program (PB0–PB3) from microcontroller 650. The program, PB0–PB3, are configured such that the programs variously enable the operator to select a short circuit test duration and a power source to be shorted. For example, with respect to FIG. 6, PB0 may be selected to provide a 1 millisecond short in +5 VME bus voltage 662, which is connected to power supply 504 of FIG. 5.

Once the program indicating the source to be shorted and the duration of the short is selected, the signal containing the program information may be debounced by microcontroller 650 prior to being provided to transistor 627 via microcontroller output 656 (PB5) and dampening resistor 628. At transistor 627, the program signal is amplified and sent to inverters 622 via the collector terminal of the transistor 627. Similar to the inverters of FIG. 4A, inverters 622 operate to ensure that the signal has a fast rise-time prior to being provided to the gate of transistor 634 of the shorting circuitry 630. As with the shorting circuitry 430 of FIG. 4A, the voltage signal is further provided to the gate of transistor 634, such that the voltage measured from the gate of the transistor 634 to the source of the transistor 634 (Vgs) is greater than the threshold voltage of the transistor 634 (Vt). The Vgs to Vt relationship described with relation to the transistor 634 which in turn, sends the transistor 634 into linear mode shorting the power supply to be tested (e.g., +5v VME bus power supply for the embodiment depicted in FIG. 6). The short generated in the power supply to be tested may be maintained during the short circuit test by a backup power supply such as the one depicted in FIG. 5. In particular, the short may be maintained by a charge delivered from capacitors 526, 528, and 530, where the sustaining charge is provided to the short circuit generator system 600 via nodes 659 at task key 610, node 635 at inverters 622, and node 654 at microcontroller 650.

Figure 7:
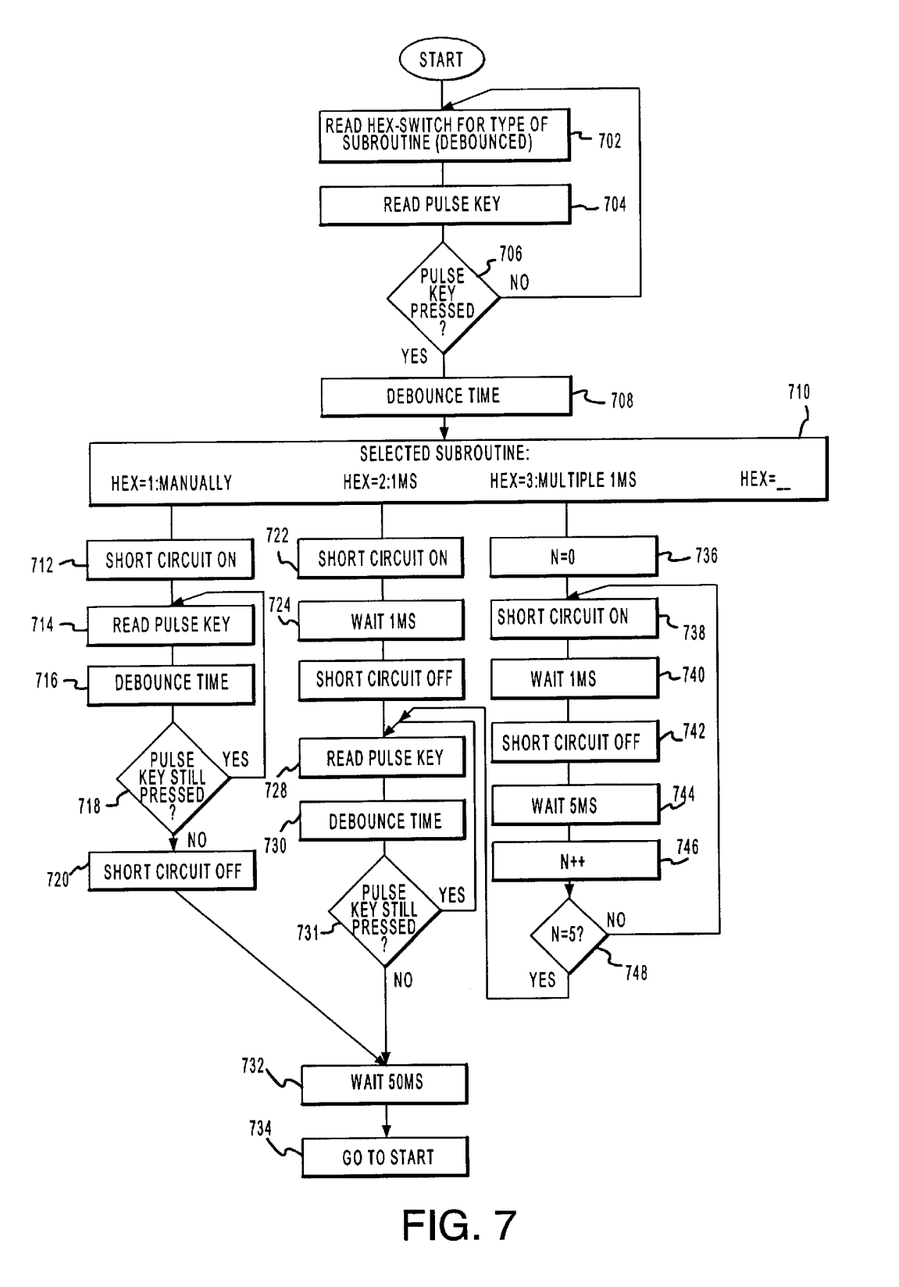
FIG. 7 illustrates an exemplary decision making flowchart in accordance with one embodiment of the present invention.

Referring now to FIG. 7, a flowchart depicting a typical decision making scheme in accordance with a short circuit system in present invention will be discussed. With reference to FIGS. 6 and 7, hex switch information is provided to the microcontroller 650, wherein the microcontroller uses the information to determine the characteristics of the short circuit testing program to be run by the short circuit generation system 600 (step 702). The pulse key 610 status information can then be read by microcontroller 650 (step 704) to determine if the task key has been pressed either manually or through program manipulation (step 708). Where the task key signal indicates that the key has been pressed, the signal provided by the pulse key is debounced for a predetermined period of time (step 708), and the short circuit testing program selected by the operator using hex switch 660 is initiated (step 710).

In addition, any number of short circuit programs (also called "subroutines") may be initiated at step 710. One manner of determining which subroutine may be initiated in step 710 may be best understood with reference to the signal provided by hex switch 660. That is, as shown in step 710, hex switch 660 may provide a signal indicating which short circuit test subroutine to run, such as, for example, hex switch state 1=manually timed testing, hex switch state 2=1 millisecond testing duration, hex switch state 3=multiple 1 millisecond testing duration and hex switch state 4=multiple power supply testing, or any combination thereof.

When the hex switch state=1, the short circuit test duration may be controlled manually, such that the short circuit is initiated (step 712) and terminated by pressing (steps 704 and 706) and releasing task key 610 (step 718), respectively. In addition, once the short circuit is initiated at step 712, the microcontroller 650 may continue to read the information provided by the task key to determine when the task key is no longer pressed (steps 714 and 718), during which time the shorting signal provided by the microcontroller 650 is debounced (step 716). Once the microcontroller 650 determines that the pulse key is no longer pressed (step 718), the short circuit is terminated (step 720). At the termination of the manual test, the short circuit generation system may wait 50 milliseconds (step 732) before returning to the start position (step 734) and evaluating the signal provided by the hex switch (step 702).

When the hex switch state 2=1 millisecond, the short circuit may be initiated at step 722, for a duration of 1 millisecond (steps 724 and 726). Once the short is terminated (step 726) the microcontroller may read the signal provided by the pulse key 610 to determine if the key remains pressed (steps 728 and 731), during which time the signal provided by the microcontroller 650 may be debounced (step 730). Similar to hex switch state=1 described above, at the termination of the hex switch state=2 short circuit test, the short circuit generation system may wait 50 milliseconds (step 732) before returning to the start position (step 734) and evaluating the information provided by the hex switch (step 702).

In addition, the short circuit generator system 600 may utilize several short circuiting schemes in a single short circuit test, where the single short circuit test may be defined by one iteration of pressing and releasing task key 610. For example, where hex switch state=3, the short circuit generation system may run a predetermined series of short circuit tests for a predetermined number of shorting sequences. With particular reference to FIG. 7, a typical method for running a series of short circuit schemes in one short circuit test is illustrated, wherein the number of short circuit schemes is predetermined using a conventional counter.

As shown in step 736, a conventional counter which may be utilized in the various exemplary embodiments of the present invention may be used to count from n=0 to n=5, where n=5 represents the number of times the short circuit scheme may be run. By way of example, at n=0 the short circuit test may be initiated (step 738) for 1 millisecond (step 740) at which time the short circuit test may be terminated (step 742). Once the short circuit is terminated at step 742, the short circuit generation system may wait for a period of time (e.g., 5 milliseconds at step 744) before proceeding with the testing and increasing the counter by a predetermined counting integer, such as, for example, increasing the counting integer by 1 (step 746). In accordance with this embodiment, the counter n=0 is increased by one (1) to n=n+1 (e.g., n=0+1=1, step 746) and then compared to the number five (5) to determine if further short circuit testing should be performed (step 748). When n<5, the short circuit test scheme will be repeated (steps 738, 740, 742, 744, and 746). Contrariwise, when n5, then the shorting scheme calls for reading the signal provided by pulse key 610 (step 728) determining if the key remains pressed (steps 728 and 731) and determining whether the signal provided by the microprocessor 650 may be debounced (step 730). Further, similar to the hex switch states described above, at the termination of the hex switch state=3 short circuit test, the short circuit generation system may wait 50 milliseconds (step 732) before returning to the start position (step 734) and evaluating the information provided by the hex switch 610 (step 702).

Although not depicted, it should be noted that the subroutines which may be defined by the short circuit generator system 600 may include variations wherein the system may be configured to test several power supply voltages during one short circuit test. For example, where various different power supply levels are present in a system application, the short circuit generator system 600 may be configured such that one short circuit scheme or test may provide a short in the various power supplies, sequentially. For instance, the system may be configured to provide a short at a +5v bus power source, followed by providing a short in a +12v power source, or any such similar combination. In addition, the short circuit generator system 600 may also be configured to perform several iterations of short circuit test with respect to each power supply present in a system application.

Although, the present invention has been described above with reference to various exemplary embodiments, those skilled in the art will recognize that changes and modifications may be made to the exemplary embodiments without departing from the scope of the present invention. For example, the various operational steps, as well as the components for carrying out the operational steps, may be implemented in alternate ways depending upon the particular application or in consideration of any number of cost functions associated with the operation of the system, e.g., various of the steps may be deleted, modified, or combined with other steps. For example, with reference to FIG. 7, steps 704, 714 and 728 may be deleted where the short circuit test initiation system comprises an automated or software driven initiation system. Further, it should be noted that while the short circuit generation system as described above is described with respect to a personal computer or other such similar system applications, the system is not to be so limited. That is, the system may be used in any procedure for evaluating the performance of a power system under short circuit conditions. Further still, the short circuit test described herein may be regulated automatically through the use of conventional computer programming, and that the description of test regulation using a task or pulse key is merely exemplary and therefore, does not limit the invention in any way. In addition, although the present invention is described with respect to a electrical signals, it is to be understood that the invention may be configured to use any suitable optical signal or the like. These and other changes or modifications are intended to be included within the scope of the present invention, as set forth in the following claims.

We claim:

1. A short circuit testing system for generating a short circuit signal in a power supply, said short circuit testing system comprising:
   a. a short circuit initiation circuitry for providing a signal for initiating a short circuit test;
   b. a debouncing and rise time control circuitry comprising inverters for inverting said signal, said debouncing and rise time control circuitry in electrical communication with said short circuit initiation circuitry, said debouncing and rise time circuitry configured to control the overshoot and rise time of said signal;
   c. a shorting circuitry in electrical communication with said debouncing and rise time control circuitry for providing said signal to a power supply to be short circuit tested, said shorting circuitry further comprising a transistor for sending said power supply to a grounding potential; and
   d. a backup power supply in electrical communication with at least one of said short circuit initiating system, debouncing and rise time control circuitry, or shorting circuitry, for providing backup power suitable for sustaining said short circuit initiation system, debouncing and rise time control circuitry, or shorting circuitry during short circuit generation.

2. A short circuit testing system according to claim 1, wherein said short circuit initiation circuitry comprises a task key, for manually controlling the initiation of said short circuit.

3. A short circuit testing system according to claim 1, wherein said short circuit initiation circuitry is controlled by computer program.

4. A short circuit testing system according to claim 1, wherein said debouncing and rise-time control circuitry comprises filtering circuitry for controlling signal overshoot and noise.

5. A short circuit testing system according to claim 1, wherein said backup power supply comprises at least one capacitor for storing electrical energy and providing said electrical energy to at least one backup power node, said backup power node further providing said electrical energy to at least one of said short circuit initiation system, debouncing and rise time control circuitry, or shorting circuitry.

6. A short circuit testing system according to claim 5, wherein said backup supply further comprises at least one diode for preventing said capacitor from discharging into grounding potential.

7. A short circuit testing system according to claim 1, wherein said short circuit testing system is configured to be adapted for use with a computer bus system.

8. A short circuit testing system according to claim 1, wherein said short circuit testing system may be positioned on a printed circuit board (PCB).

9. A short circuit testing system for generating a short circuit signal in a power supply, said short circuit testing system comprising:
   a. a short circuit program selection and signal debouncing circuitry for selecting a predetermined short circuit program to be executed;
   b. a task initiating circuitry in electrical communication with said short circuit program selection and signal debouncing circuitry, said task initiating circuitry configured to provide a signal for initiating a short circuit test to said short circuit program selection and signal debouncing circuitry;
   c. an inverting circuit in electrical communication with said short circuit program selection and signal debouncing circuitry for inverting said signal; and
   d. a shorting circuitry in electrical communication with said inverters for providing a short circuit signal to a power supply to be short circuit tested, said shorting circuitry further comprising a transistor for sending said power supply to a grounding potential;
   e. a backup power supply in electrical communication with at least one of said short circuit program selection and signal debouncing circuitry, task initiating circuitry, inverting circuitry and shorting circuitry, said backup power supply providing power suitable for sustaining at least one of said short circuit program selection and signal debouncing circuitry, task initiating circuitry, inverting circuitry and shorting circuitry.

10. A short circuit testing system according to claim 9, wherein said task initiation circuitry comprises a task key, for manually controlling the initiation of said short circuit.

11. A short circuit testing system according to claim 9, wherein said task initiation circuitry is controlled by computer program.

12. A short circuit testing system according to claim 9, wherein said short circuit program selection and signal debouncing circuitry comprises a microcontroller for storing short circuit subroutines, said microcontroller being further configured to debounce said signal for initiating a short circuit test provided by said task initiating circuitry, said debounced signal being further provided to said inverting circuitry.

13. A short circuit testing system according to claim 9, wherein said short circuit program selection and signal debouncing circuitry further comprises a hex switch in electrical communication with said microcontroller, said hex switch configured to select said short circuit subroutine to be initiated by said microcontroller.

14. A short circuit testing system according to claim 9, wherein said inverters are configured to control the rise-time of said debounced signal.

15. A short circuit testing system according to claim 9, wherein said backup power supply comprises at least one capacitor for storing electrical energy and providing said electrical energy to at least one backup power node, said backup power node further providing said electrical energy to at least one of said short circuit program selection and signal debouncing circuitry, task initiating circuitry, inverting circuitry, or shorting circuitry.

16. A short circuit testing system according to claim 15, wherein said backup supply further comprises at least one diode for preventing said capacitor from discharging into grounding potential.

17. A short circuit system according to claim 9, wherein said short circuit may be provided to said power supply for a predetermined test duration.

18. A short circuit system according to claim 9, wherein said shorting circuit may be provided to multiple power supplies during said short circuit test.

19. A short circuit testing system according to claim 9, wherein said short circuit testing system is configured to be adapted for use with a computer bus system.

20. A short circuit testing system according to claim 9, wherein said short circuit testing system may be positioned on a printed circuit board (PCB).

* * * * *